United States Patent
Akram et al.

(10) Patent No.: US 6,713,879 B2
(45) Date of Patent: *Mar. 30, 2004

(54) SEMICONDUCTOR SUBSTRACT WITH SUBSTANTIALLY MATCHED LINES

(75) Inventors: Salman Akram, Boise, ID (US); John O. Jacobson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/191,654

(22) Filed: Jul. 8, 2002

(65) Prior Publication Data

US 2002/0175422 A1 Nov. 28, 2002

Related U.S. Application Data

(63) Continuation of application No. 09/653,139, filed on Aug. 31, 2000, now Pat. No. 6,462,423.

(51) Int. Cl.$^7$ ............................................. H01L 29/40
(52) U.S. Cl. ...................... 257/778; 257/778; 257/773; 257/777
(58) Field of Search ................. 257/778, 666, 257/698, 773, 776, 777; 327/298

(56) References Cited

U.S. PATENT DOCUMENTS

| | | |
|---|---|---|
| 4,183,041 A | 1/1980 | Goel |
| 4,551,746 A | 11/1985 | Gilbert et al. |
| 4,626,889 A | 12/1986 | Yamamoto et al. |
| 4,833,521 A | 5/1989 | Early |
| 5,089,881 A | 2/1992 | Panicker |
| 5,221,858 A | 6/1993 | Higgins, III |
| 5,245,214 A * | 9/1993 | Simpson ..................... 257/666 |
| 5,399,902 A | 3/1995 | Bickford et al. |
| 5,422,513 A | 6/1995 | Marcinkiewicz et al. |
| 5,482,898 A | 1/1996 | Marrs |
| 5,623,628 A | 4/1997 | Brayton et al. |
| 5,629,241 A | 5/1997 | Matloubian et al. |
| 5,696,466 A | 12/1997 | Li |
| 5,717,245 A | 2/1998 | Pedder |
| 5,751,554 A * | 5/1998 | Williams et al. ............ 361/760 |
| 5,757,074 A | 5/1998 | Matloubian et al. |
| 5,877,552 A | 3/1999 | Chiang |
| 5,898,217 A | 4/1999 | Johnston |
| 5,945,886 A | 8/1999 | Millar |
| 5,950,304 A | 9/1999 | Khandros et al. |
| 5,952,726 A | 9/1999 | Liang |
| 5,977,617 A | 11/1999 | Kata |
| 5,983,089 A | 11/1999 | Mohwinkel et al. |
| 6,018,196 A | 1/2000 | Noddin |
| 6,020,220 A | 2/2000 | Gilleo et al. |
| 6,020,637 A | 2/2000 | Karnezos |
| 6,037,822 A * | 3/2000 | Rao et al. ..................... 327/298 |
| 6,048,753 A | 4/2000 | Farnworth et al. |
| 6,054,758 A | 4/2000 | Lamson |
| 6,114,751 A | 9/2000 | Kumakura et al. |
| 6,121,815 A | 9/2000 | Terada et al. |
| 6,211,576 B1 | 4/2001 | Shimizu et al. |
| 6,346,743 B1 | 2/2002 | Figueroa et al. |
| 6,377,464 B1 | 4/2002 | Hashemi et al. |
| 6,380,616 B1 * | 4/2002 | Tutsch et al. ................ 257/686 |
| 6,462,423 B1 | 10/2002 | Akram et al. |

* cited by examiner

*Primary Examiner*—David Nelms
*Assistant Examiner*—Thinh Nguyen
(74) *Attorney, Agent, or Firm*—TraskBritt (57) ABSTRACT

A method and apparatus for substantially reducing the need for capacitive and inductive compensation for signal lines on a flip-chip semiconductor device. A flip-chip semiconductor device is disclosed having signal lines of substantially equal length. At least one ground plane is also disposed on the flip-chip device and separated from the signal lines by a dielectric layer. By using a ground plane and signal lines having substantially equal lengths, impedance caused by electromagnetic and electrostatic coupling is significantly reduced, and impedance from signal line length is balanced such that the loads on each of the signal lines, as viewed by the semiconductor die, are substantially equal.

20 Claims, 6 Drawing Sheets

SEMICONDUCTOR SUBSTRACT WITH SUBSTANTIALLY MATCHED LINES

CROSS-REFERENCE TO RELATED APPLICATION

This application is a continuation of application Ser. No. 09/653,139, filed Aug. 31, 2000, now U.S. Pat. No. 6,462,423, issued Oct. 8, 2002.

BACKGROUND OF THE INVENTION

1. Field of the Invention

The present invention relates generally to compensation for impedance, capacitance and inductance through matching conductive line lengths on a flip-chip semiconductor device. Particularly, the invention includes at least one ground plane and signal lines having matched lengths to simplify compensation circuitry.

2. State of the Art

Interconnection and packaging related issues are among the factors that determine not only the number of circuits that can be integrated on a chip, but also the performance of the chip. These issues have gained in importance as advances in chip design have led to reduced sizes of transistors and enlarged chip dimensions. The industry has come to realize that merely having a fast chip will not necessarily result in a fast system; the fast chip must also be supported by equally fast and reliable connections. Essentially, the connections, in conjunction with the packaging, supply the chip with signals and power, and redistribute the tightly packed terminals of the chip to the terminals of a carrier substrate such as a printed wiring board.

Figure 1:
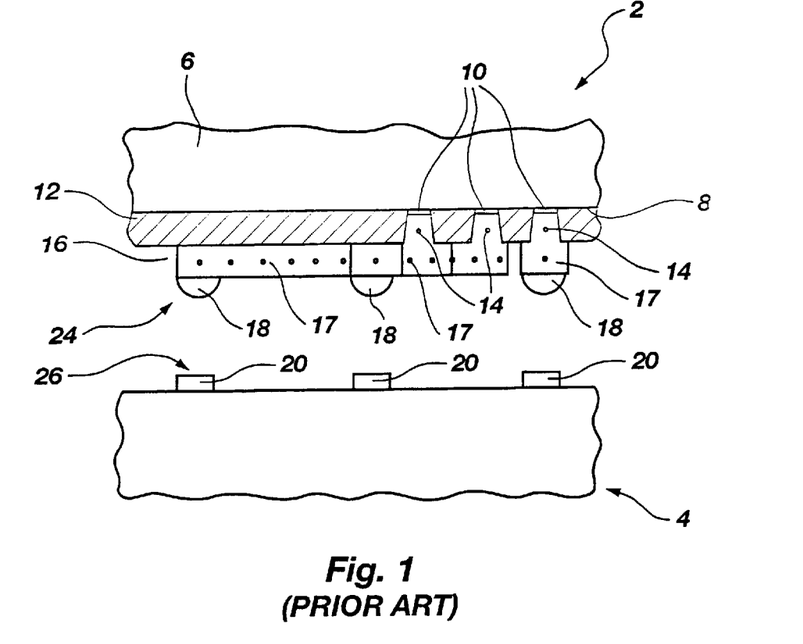
FIG. 1 is a front surface view of a prior art flip-chip semiconductor device.
Figure 2:
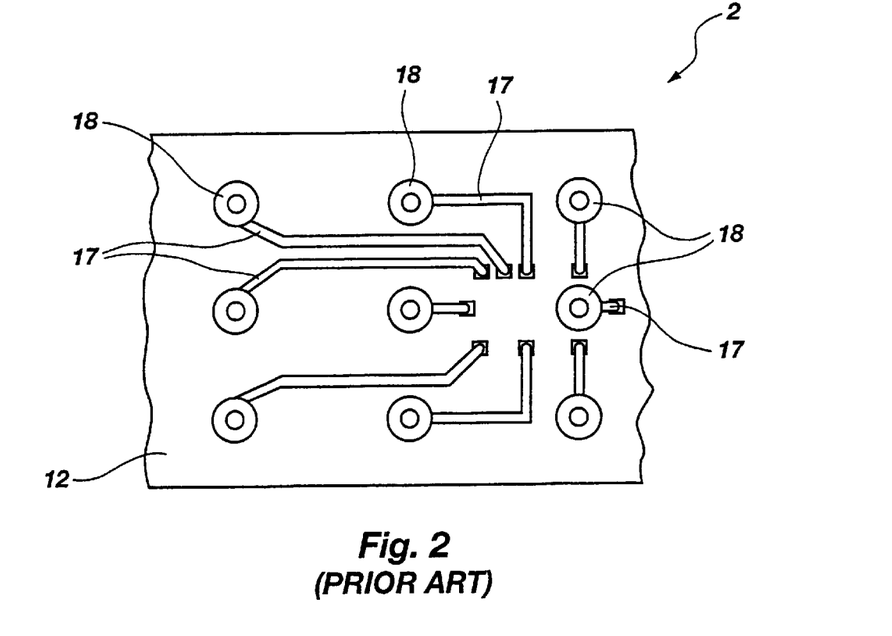
FIG. 2 is a cross-sectional view of a prior art flip-chip semiconductor device and carrier substrate.

FIGS. 1 and 2 illustrate a prior art flip-chip semiconductor device 2 in conjunction with a carrier substrate 4. Flip-chip technology, including its fabrication and use is well known to those of ordinary skill in the art as this technology has been in use and developed for over 30 years. As shown in FIG. 1, a flip-chip semiconductor device 2 conventionally comprises an active semiconductor die 6 having an active surface 8 and active surface contacts or bond pads 10. A dielectric layer 12, for example, of silicon dioxide or silicon nitride, is formed over the active surface 8 by techniques well known in the art. Vias 14 are defined in dielectric layer 12, for example, using well-known photolithographic techniques to mask and pattern the dielectric layer 12 and etching same, for example, with buffered HF to expose the active surface contacts or bond pads 10 of the active surface 8. The bond pads 10 may be connected to traces of an electrical interconnect layer 16 on the dielectric layer 12 in the form of power, ground and signal lines 17 in a well-known manner, for example, by evaporating or sputtering aluminum or an alloy thereof, followed by masking and etching. The signal lines 17 of the electrical interconnect layer 16 enable the relatively compact array of bond pads 10 to be distributed over a broader surface area. Solder bumps 18, or balls, are placed upon ends of the signal lines 17 of the electrical interconnect layer 16 to enable electrical coupling with contact pads 20 on the carrier substrate 4, such as a printed wiring board. The flip-chip semiconductor device 2, with the solder bumps 18, is inverted so that its front surface 24 faces toward the top surface 26 of the carrier substrate 4, with each solder bump 18 on the semiconductor device 2 being positioned on the appropriate contact pad 20 of the carrier substrate 4. The assembly of the flip-chip semiconductor device 2 and the carrier substrate 4 is then heated so as to liquify the solder bumps 18 and thus connect each bond pad 10 on the semiconductor device 2 to an associated contact pad 20 on the carrier substrate 4.

Because the flip-chip arrangement does not require leads coupled to the active surface of a die and extending beyond the lateral periphery thereof, it provides a compact assembly in terms of the die's "footprint." In other words, the area of the carrier substrate 4 occupied by the contact pads 20 is, for a given die, the same or less than that occupied by the die itself. Furthermore, the contacts on the die, in the form of solder bumps 18, may be arranged in a so-called "area array" disposed over substantially the entire front face of the die. Flip-chip bonding, therefore, is well suited for use with dice having large numbers of I/O contacts, in contrast to wire bonding and tape-automated bonding techniques which are far more limiting in terms of the number of bond pads which may reasonably and reliably be employed. As a result, the maximum number of I/O and power/ground terminals available can be increased, and signal and power/ground interconnections can be more efficiently routed on the dice. Examples of methods of fabricating semiconductor die assemblies using flip-chip and other techniques are described in U.S. Pat. No. 6,048,753 to Farnworth et al. (Apr. 11, 2000), U.S. Pat. No. 6,018,196 to Noddin (Jan. 25, 2000), U.S. Pat. No. 6,020,220 to Gilleo et al. (Feb. 1, 2000), U.S. Pat. No. 5,950,304 to Khandros et al. (Sep. 14, 1999), and U.S. Pat. No. 4,833,521 to Early (May 23, 1989).

As with any conductive line carrying a signal, signal lines for integrated circuits generate electromagnetic and electrostatic fields. These electromagnetic and electrostatic fields may affect the signals carried in adjacent signal lines unless some form of compensation is used. It is known to use a ground plane to couple the cross-talk from a signal line on a flip-chip package. An example of a flip-chip semiconductor device using a ground plane is shown and described in U.S. Pat. No. 6,020,637 to Karnezos (Feb. 1, 2000), the disclosure of which is hereby incorporated herein by reference.

Electromagnetic and electrostatic coupling between signal lines, or "cross-talk", is undesirable because it increases the impedance of the signal lines and may create impedance mismatching and signal delays. The primary factors affecting cross-talk include the surface area of the signal line directed to an adjacent signal line, which includes signal line length, the distance between the signal lines and the dielectric constant ($\epsilon_r$) of the material between the signal lines. For flip-chip devices, where a large number of contacts with attached signal lines are used to carry signals to various locations for convenient access, impedance can be a significant factor affecting the speed of the system.

One further aspect of flip-chip packaging which adds to the complexity of matching the impedances of the lines is varied line lengths externally between bond pads or other contacts on a die and the solder bumps. To achieve a faster system in a semiconductor environment, conventional wisdom encourages the shortest signal line possible because the shorter the distance the signal needs to travel, the faster it arrives. As a result, when a signal line path is designed for placement on a semiconductor die, or other carrier substrate, it is typically designed with each signal line having an optimal path such that it travels on as short a path as possible, given the overall layout of all the signal line paths. In other words, the signal lines travel in as direct a path as possible from their origins to their destinations, with some variance to accommodate for the paths of other signal lines and positions of various components. For a given die architecture matched to a given I/O array architecture for a specific application, existing signal line lengths are, therefore, varied. Because the impedance of the signal line is, in part, dependent upon the length of the signal line, the impedances of the signal lines of varied length will, therefore, also be varied. Furthermore, due to varied impedance and signal line lengths, signals traveling on those signal lines of different lengths have varied travel times and associated delays.

When the impedance loads on multiple signal lines fed by a common die are equal, the signal strength of the overall system is strongest and signal transfer is most reliable. Impedance mismatches between the signal lines may cause undesirable signal reflections and delays. It is most desirable to have equal impedance loads on each signal line associated with a die, as viewed from the die. To accomplish this, a method used with flip-chip and other type packaging is to add inductors and capacitors to balance the load on each signal line as seen by the semiconductor die. Adding inductors and capacitors, however, while helpful in balancing mismatched impedance, is a difficult way to match impedance precisely to a given system in all environments, is relatively more expensive than without such capacitors and inductors, and undesirably increases the power consumed and heat produced by the system.

Therefore, it is desirable to have a flip-chip packaged semiconductor device having matched impedance on its respective signal lines, as viewed by the semiconductor die, without the heat-producing and power-consuming capacitors and inductors used previously.

BRIEF SUMMARY OF THE INVENTION

The present invention provides a relatively inexpensive alternative to the inductors and capacitors conventionally used to match impedance for flip-chip signal lines. According to the present invention, each signal line on a flip-chip semiconductor device has substantially a common length, regardless of the signal line's origin and destination on the device. By adding bends and direction changes into the conventional paths of signal lines on a flip-chip device, the overall length of each of the signal lines may be made substantially equal. Additionally, a ground plane may be placed above or below a signal line layer, or both above and below it, separated from the signal line layer by a dielectric layer. By placing a ground plane near the signal line layer, the signal lines are isolated from the active surface of the die or the signal lines on a circuit board, or both, and a reference is created for matching impedance. The ground plane further allows signals on the various signal lines to have a return path to the power source. By the signal lines each having a common electrical length, they also have a common impedance, common time required for signal propagation, and other common characteristics and thus do not require compensation using inductors and capacitors.

In a first embodiment, an array of bond pads is disposed on a carrier substrate and coupled to an array of discrete conductive elements also disposed on the carrier substrate, through a plurality of signal lines, each of a substantially common length. As will be clear to one of ordinary skill in the art, the discrete conductive elements may include, by example only, solder bumps, conductive or conductor-allied epoxy pillars or bumps, polymer contacts containing conductive particles, other metallic elements other than solder, or other discrete conductive elements known in the art. In a second embodiment, the array of bond pads is disposed in a single row of bond pads along the center of a semiconductor die surface. In a third embodiment, the array of bond pads comprises two rows of bond pads along the center of a semiconductor die surface. In a fourth embodiment, the signal lines extend from the conductive elements to locations near one or more rows of bond pads. The signal lines are then wire bonded to the bond pads.

A method of manufacturing flip-chip semiconductor devices is disclosed wherein a first dielectric passivation layer is deposited on a surface of a semiconductor die having bond pads, and portions of the first passivation layer are removed to expose the bond pads. A conductive layer is deposited over the first dielectric passivation layer, and portions of the conductive layer are removed to define ground, power or signal lines, or traces, extending in substantially common lengths to locations for conductive elements. A second dielectric passivation layer is deposited over the conductive signal lines, and portions of the second passivation layer are removed to allow access to the conductive signal lines at the conductive element locations. A ground plane is deposited over portions of the second passivation layer, leaving the conductive element locations exposed and surrounded by a boarder of dielectric material. A dielectric layer is deposited over portions of the ground plane to insulate the ground plane from the conductive elements which are coupled to the conductive signal lines at the conductive element locations. Alternatively or additionally, a ground plane may be deposited before the conductive signal line layer and separated from it by an additional dielectric passivation layer and borders of dielectric material through which conductive elements may extend from the semiconductor die surface to the conductive element locations.

An electronic system is disclosed comprising a processor, a memory device, an input, an output and a storage device, at least one of which includes a flip-chip semiconductor device having signal lines, each of a substantially common length. A semiconductor wafer is disclosed having at least one flip-chip semiconductor device having signal lines, each of a substantially common length.

BRIEF DESCRIPTION OF THE SEVERAL VIEWS OF THE DRAWINGS

The nature of the present invention as well as other embodiments of the present invention may be more clearly understood by reference to the following detailed description of the invention, to the appended claims, and to several drawings herein, wherein:

DETAILED DESCRIPTION OF THE INVENTION

To ensure that each of the signal lines of a flip-chip semiconductor device have matched impedance as seen by the semiconductor die, the present invention includes a ground plane and signal lines, each having substantially equal signal line length. By creating a device having signal lines of substantially equal lengths, there is no need to additionally compensate for the varied impedance of the signal lines using inductors and capacitors. A system without compensating inductors and capacitors produces less heat and reduces the overall power consumption of the system.

Figure 3:
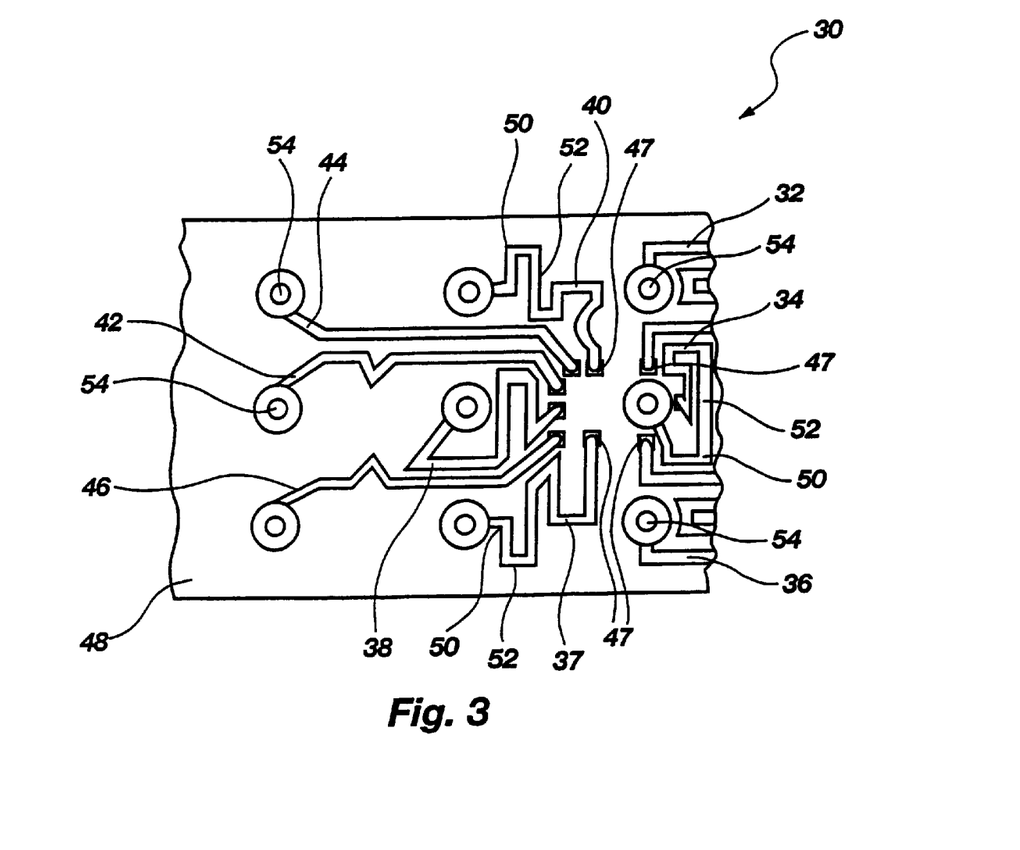
FIG. 3 is a front surface view of a flip-chip semiconductor device according to a first embodiment of a first aspect of the present invention.

FIG. 3 is a view of a surface of a portion of a flip-chip semiconductor device 30 having signal lines 32, 34, 36, 37, 38, 40, 42, 44 and 46 of substantially equal lengths. According to a first embodiment of a first aspect of the present invention, the signal lines 32, 34, 36, 37, 38, 40, 42 and 46, which would conventionally be shorter due to their positions in relation to respective bond pads 47 on the active surface of the semiconductor die 48, each have additional direction changes 50 and line lengths 52 added to extend their overall line length to be substantially equal to that of the longest signal line 44. In this way, and because each of the signal lines 32, 34, 36, 37, 38, 40, 42, 44 and 46 is conventionally formed of the same conductive material having the same properties and the same width and height, the electrical signals carried by the signal lines 32, 34, 36, 37, 38, 40, 42, 44 and 46 must each travel the same distance through the same conductive medium between the bond pads 47 and the conductive elements 54. Thus, the impedance "seen" by the semiconductor die 48 on each signal line 32, 34, 36, 37, 38, 40, 42, 44 and 46 is substantially the same. Additionally, signal delays and clock skew caused by varied signal line lengths is avoided.

Because signal lines are conventionally formed by selectively removing conductive material from a conductive layer using well-known photolithographic techniques and etching, adding additional direction changes 50 and lengths 52 to the signal lines 32, 34, 36, 37, 38, 40, 42, 44 and 46 will not add additional expense or steps to the semiconductor fabrication process, as the mask pattern used to define the signal lines in a layer of conductive material deposited over the active surface of the die may easily be configured to provide the substantially equal signal line lengths.

Figure 4:
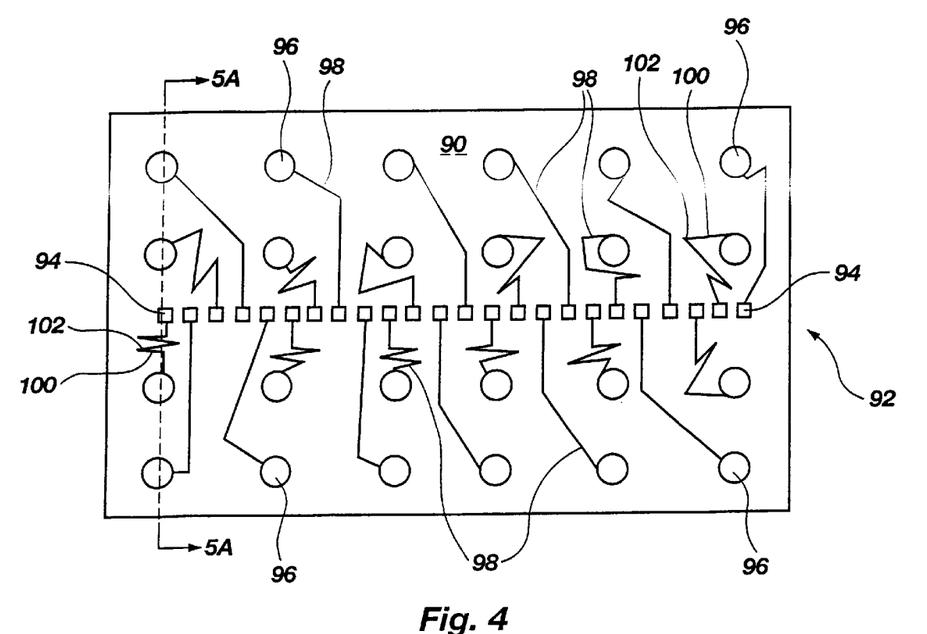
FIG. 4 is a front surface view of a flip-chip semiconductor device according to a second embodiment of the first aspect of the present invention.

FIG. 4 illustrates a second embodiment of the first aspect of the invention. FIG. 4 shows a first array of connections to the surface 90 of a semiconductor die 92 in the form of bond pads 94 in a single row. A second array of connections, in the form of conductive elements 96, is distributed over the surface 90 of the semiconductor die 92. Most preferably, the conductive elements 96 are distributed substantially uniformly over the surface 90 of the semiconductor die 92 to maximize the pitch of, or spacing between, the conductive elements 96. However, any arrangement of conductive elements 96 is acceptable for use with the present invention. Each bond pad 94 is coupled to a conductive element 96 through a signal line 98 comprising a substantially equal length. To achieve substantially equal lengths for all signal lines, as with the first embodiment shown in FIG. 3, additional line lengths 100 and direction changes 102 are added to a portion of the plurality of signal lines 98. For simplicity, signal lines 98 have been shown schematically in FIG. 4 as mere lines, rather than as wider conductive traces as depicted with respect to the signal lines of FIG. 3. Those of ordinary skill in the art will, however, understand and appreciate that formation of signal lines on semiconductor devices is a well-known technology and that selecting a suitable width for same is conventional.

Figure 5:
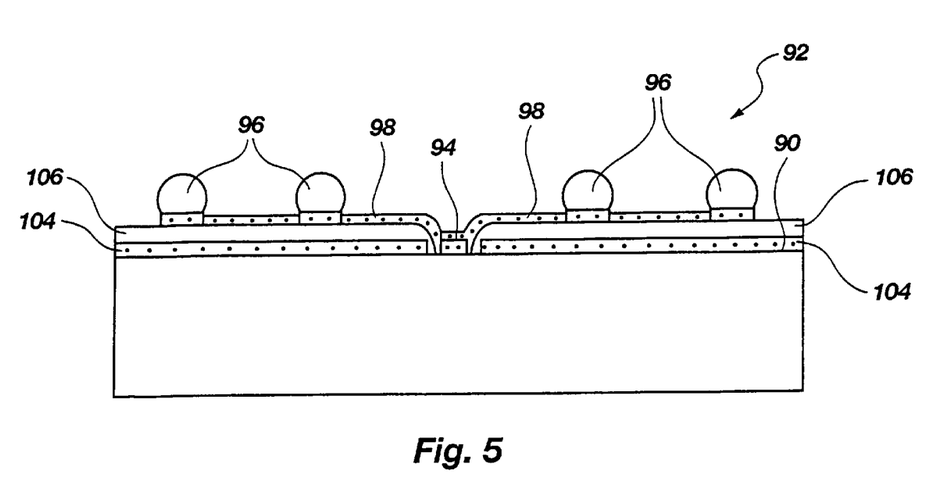
FIG. 5 is a cross-sectional view of the flip-chip semiconductor device of FIG. 4 sectioned along line 5A—5A.

FIG. 5 shows a cross-sectional view of the semiconductor die 92 of FIG. 4 along line 5A—5A. FIG. 5 also shows a ground plane 104 and a dielectric passivation layer 106 disposed between the surface 90 of the semiconductor die 92 and the signal lines 98.

Figure 6:
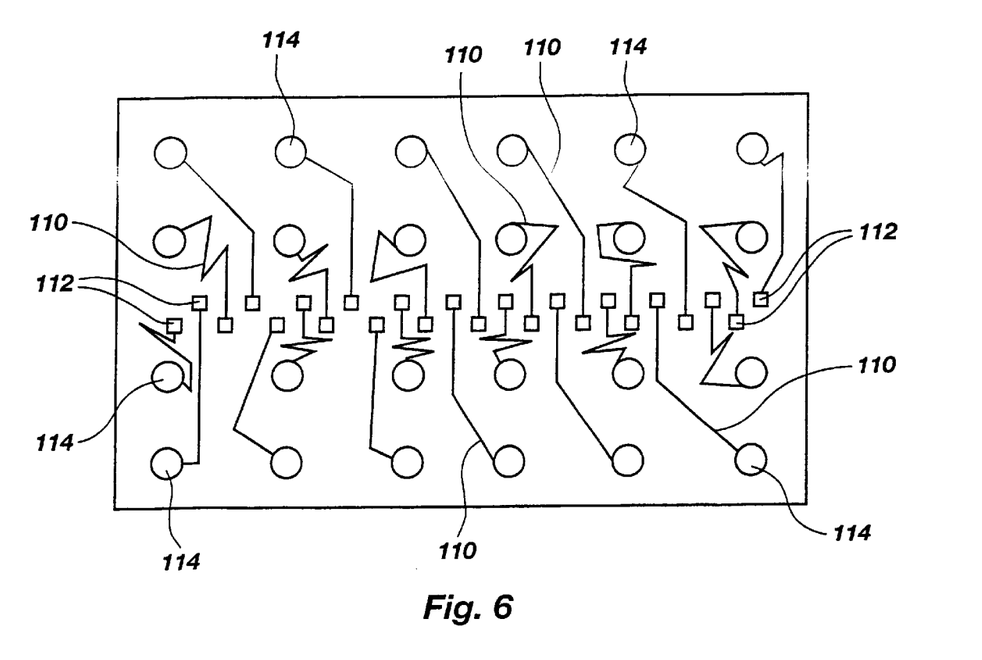
FIG. 6 is a front surface view of a flip-chip semiconductor device according to a third embodiment of the first aspect of the present invention.

FIG. 6 illustrates a third embodiment of the first aspect of the invention. Though the lengths of signal lines 110 are all substantially equal between the bond pads 112 and the conductive elements 114, as with previous embodiments, the bond pads 112 are in two rows rather than one. For simplicity, signal lines 110 have been shown schematically in FIG. 6 as mere lines, rather than as wider conductive traces as depicted with respect to the signal lines of FIG. 3. Those of ordinary skill in the art will, however, understand and appreciate that formation of signal lines on semiconductor devices is a well-known technology and that selecting a suitable width for same is conventional.

Figure 7:
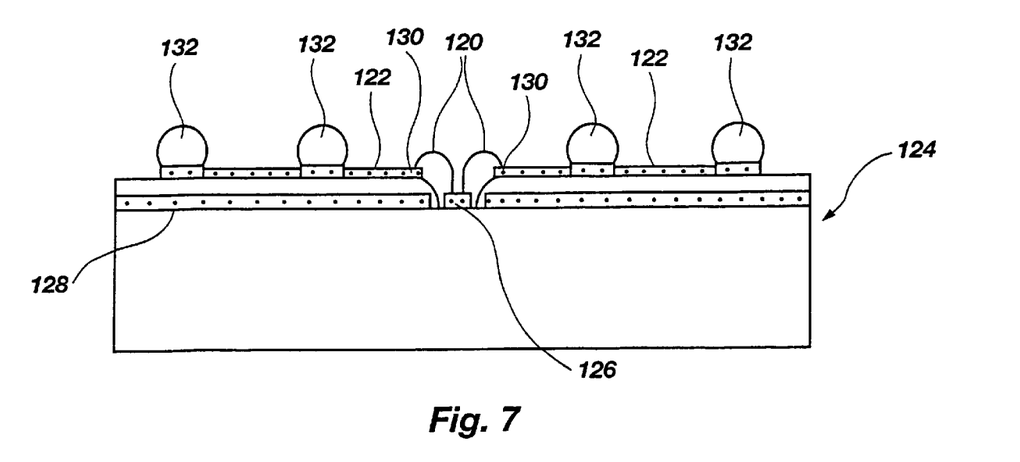
FIG. 7 is a cross-sectional view of a flip-chip semiconductor device according to a fourth embodiment of the first aspect of the present invention.

FIG. 7 shows a fourth embodiment of the first aspect of the invention. In the embodiment shown in FIG. 7, the signal line lengths include a portion of bond wire 120 as a connection between traces 122 placed on the semiconductor die 124 and bond pads 126 coupled to the active surface 128 of the semiconductor die 124. The bond wires 120 may be bonded directly to the traces 122, or additional bond pads may be placed at the ends 130 of the traces 122 to facilitate bonding. Furthermore, the traces 122 and solder balls 132 may alternatively be formed on a carrier substrate separate from the semiconductor die 124 and the carrier substrate be placed over the semiconductor die surface 128 and adhered thereto. By configuring the traces 122 to have substantially equal lengths between the solder balls 132 and the trace ends 130, the advantages of the invention may be realized. Additionally, the bond wires 120 are most preferably of substantially equal lengths. The embodiment shown in FIG. 7 is particularly useful for adapting leads over chip (LOC) die architectures for use with ball grid arrays (BGAs).

Figure 8:
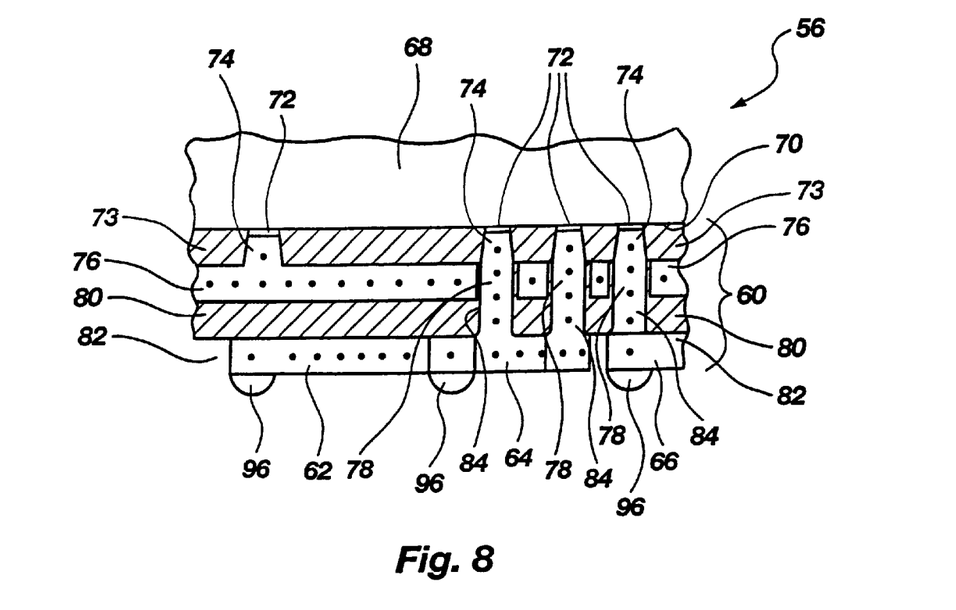
FIG. 8 is a cross-sectional view of a flip-chip semiconductor device according to a first embodiment of a second aspect of the present invention.

FIG. 8 is a cross-sectional view of a flip-chip semiconductor device 56, such as that shown in FIG. 3, having at least one ground plane 76 according to a first embodiment of a second aspect of the present invention. The ground plane 76 is included among the flip-chip semiconductor device layers 60 to provide a reference basis for matching impedance and isolate each of the signal lines 62, 64 and 66 from the electromagnetic and electrostatic fields emanating from adjacent signal lines and circuitry. A semiconductor die 68 having an active surface 70 and active surface contacts in the form of bond pads 72 is provided. A first dielectric layer 73 is formed over the active surface 70 and patterned to expose the bond pads 72 through openings or vias 74. A ground plane 76 is then formed on the first dielectric layer 73 in a well-known manner, such as by sputtering or evaporation of aluminum or aluminum alloy, and coupled to the bond pads 72 through the vias 74. Selected portions of the ground plane 76 are then defined, for example, using well-known photolithographic techniques and etched to form vias 78. This etching is performed, for example, using a solution consisting of nitric and phosphoric acids.

A second dielectric layer 80 is then formed, for example, by low-pressure chemical vapor deposition or spin-on polymer passivation, as well known to those of ordinary skill in the semiconductor art. It is important to note that the second dielectric layer 80 is formed not only on the upper surface of the ground plane 76, but also on the surface of the ground plane 76 located within the vias 78, thus preventing electrical connection between the ground plane 76 and the to-be-formed electrical interconnect layer 82. Vias 84 are then defined using methods well known in the art, such as well-known photolithographic techniques and etching, to expose selected bond pads 72 which are to be connected to the electrical interconnect layer 82. The electrical interconnect layer 82 is then formed having signal lines 62, 64, and 66 of substantially equal lengths in a well-known manner, for example, by evaporating or sputtering aluminum or an aluminum alloy. Conductive elements 96 are placed upon portions of the electrical interconnect layer 82. The signal lines 62, 64, and 66 have substantially equal lengths by adding bends and lengths to make each of the signal lines 62, 64, and 66 substantially as long as the longest signal line.

By placing a ground plane 76 between the active surface 70 of the semiconductor die 68 and the electrical interconnect layer 82, the signal lines 62, 64, and 66 are isolated from the circuitry on the active surface 70. By placing the ground plane 76 sufficiently close to the electrical interconnect layer 82, the signal lines 62, 64, and 66 are isolated from each other. How close the ground plane 76 must be to the signal lines 62, 64, and 66 to sufficiently couple the electromagnetic and electrostatic fields from the signal lines 62, 64, and 66 to prevent cross-talk is dependent upon a number of factors including, for example, the height of the signal lines, the distance between the signal lines, material from which the signal lines are formed and the material between the signal lines. It is believed that one of ordinary skill in the art may readily determine the spacing required between the ground plane 76 and the electrical interconnect layer 82 to adequately couple the electromagnetic and electrostatic fields from the signal lines 62, 64, and 66 for a given application and architecture.

Figure 9:
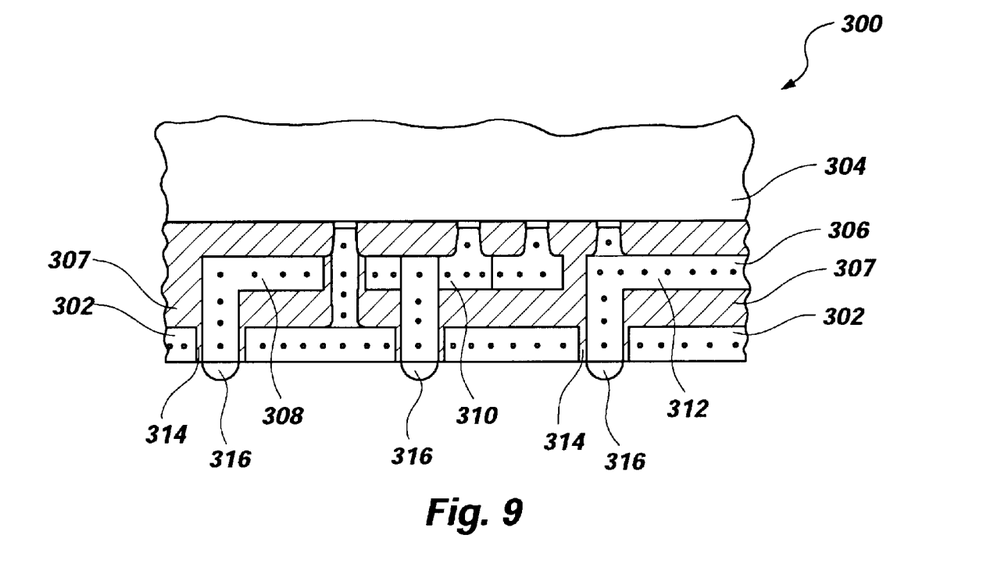
FIG. 9 is a cross-sectional view of a flip-chip semiconductor device according to a second embodiment of the second aspect of the present invention.

FIG. 9 is a cross-sectional view of a portion of a flip-chip semiconductor device 300 having at least one ground plane 302 according to a second embodiment of the second aspect of the present invention. The at least one ground plane 302 of the flip-chip semiconductor device 300 of the second embodiment, rather than being placed between the semiconductor die 304 and the electrical interconnect layer 306, is placed above the electrical interconnect layer 306, separated therefrom by a dielectric layer 307. By placing the ground plane 302 above the electrical interconnect layer 306, the ground plane 302 isolates the signal lines 308, 310 and 312, each of substantially equal length, from circuitry on a substrate such as a printed wiring board to be coupled to the flip-chip semiconductor device 300. The fabrication techniques and methods for placing a ground plane 302 above the electrical interconnect layer 306 are similar to the techniques and methods for placing the ground plane 302 below the electrical interconnect layer 306 and are known to one of ordinary skill in the semiconductor art. It will also be clear to one of ordinary skill in the art that a dielectric or passivation material 314 must also be placed between the ground plane 94 and the conductive elements 316 to electrically isolate the conductive signals traveling through the conductive elements 316 to the electrical interconnect layer 98 from the ground plane 94.

Figure 10:
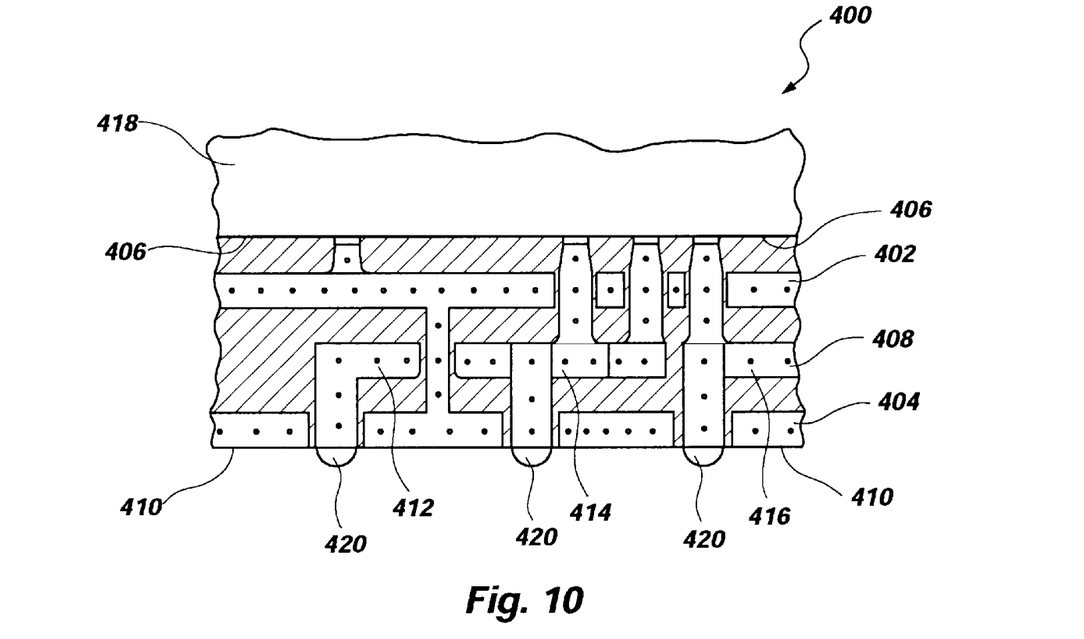
FIG. 10 is a cross-sectional view of a flip-chip semiconductor device according to a third embodiment of the second aspect of the present invention.

FIG. 10 is a cross-sectional view of a portion of a flip-chip semiconductor device 400 having at least two ground planes 402 and 404 according to a third embodiment of the second aspect of the present invention. This third embodiment combines the first and second embodiments in that there are two ground planes 402 and 404. By placing a ground plane 402 between the active surface 406 of the semiconductor device 400 and the electrical interconnect layer 408, and a ground plane 404 between the electrical interconnect layer 408 and the outer surface 410 of the semiconductor device 400, the electrical interconnect layer 408 and corresponding signal lines 412, 414 and 416, each of substantially equal length, are isolated from both the active circuitry on the semiconductor die 418 and from any circuitry on a substrate such as a printed wiring board to be coupled to the flip-chip semiconductor device 400 through conductive elements 420. One of ordinary skill in the art will understand how to combine the first and second embodiments to fabricate the present embodiment.

With any of these embodiments, it may also be desirable to place a dielectric or passivation layer on the upper surface of the flip-chip semiconductor device, leaving the conductive elements exposed, to protect the upper conductive layer from coming in contact with other conductive signal lines, grounding to another component, or contacting solder overflow from the flip-chip bonding process. It is also contemplated and will be understood by one of ordinary skill in the art that while only a single electrical interconnect layer has been shown and described with respect to each of the embodiments herein, two or more electrical interconnect layers may be formed, each separated from other conductive layers by a dielectric layer or two dielectric layers and a ground plane using similar methods well known in the art.

It is contemplated, and will be clear to one of ordinary skill in the art, that the principles of the present invention are applicable to semiconductor architectures and fabrication techniques relating to other flip-chip forms, and those other than flip-chip semiconductor architectures and fabrication techniques. For example, the present invention may also reduce signal skew and eliminate the need for capacitive and inductive compensation for controlled collapse chip connections (C4s), chip scale packaging (CSP), lead frame bonded architectures and tape automated bonding (TAB) architectures. It will also be clear to one of ordinary skill in the art that, though the embodiments shown are directed to particular shapes and dimensions of chip packaging, the principles of the present invention may be readily adapted for use with any size or shape semiconductor package, including, without limitation, square and rectangular shaped semiconductor dies, and any configuration of bond pads or conductive elements whether distributed uniformly across the die, gathered in selected regions of the die, arranged around the periphery of the die or along the center of the die. It is believed that one of ordinary skill in the art may readily adapt the principles taught herein to other existing semiconductor architectures.

Figure 11:
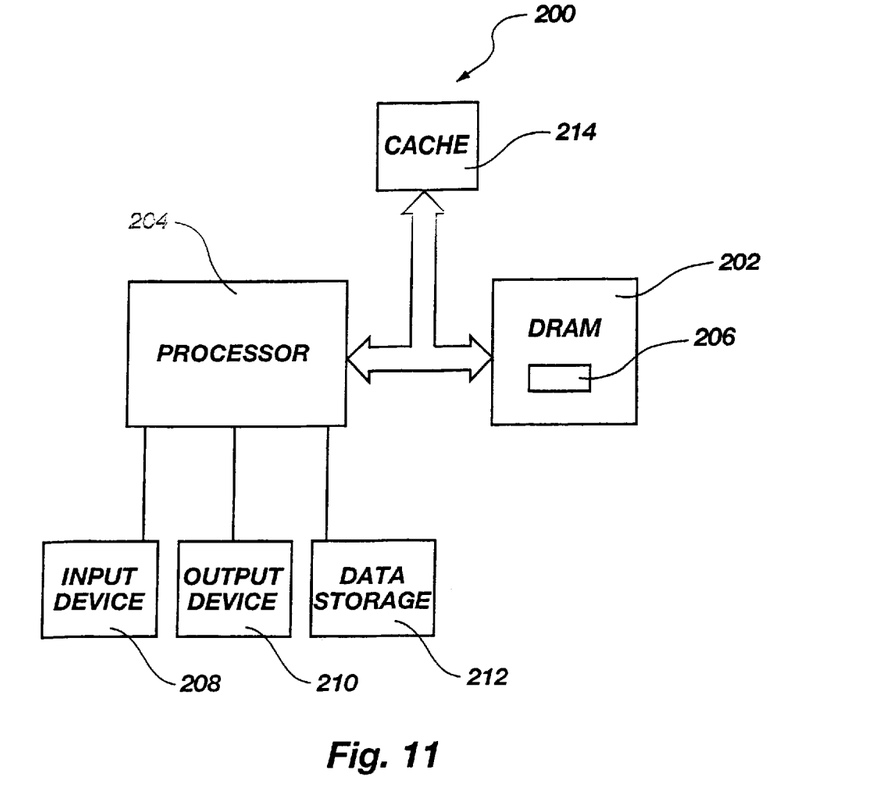
FIG. 11 is a block diagram of an electrical system comprising a flip-chip semiconductor device according to an embodiment of the present invention.

FIG. 11 is a block diagram of an electronic system 200 which includes components having one or more flip-chip semiconductor devices 206 having signal lines of substantially equal lengths and configured according to one or more embodiments of the present invention. The electronic system 200 includes a processor 204 for performing various computing functions, such as executing specific software to perform specific calculations or tasks. Additionally, the electronic system 200 includes one or more input devices 208, such as a keyboard or a mouse, coupled to the processor 204 to allow an operator to interface with the electronic system 200. The electronic system 200 also includes one or more output devices 210 coupled to the processor 204, such output devices including such outputs as a printer, a video terminal or a network connection. One or more data storage devices 212 are also conventionally coupled to the processor 204 to store or retrieve data from external storage media (not shown). Conventional storage devices 212 include, but are not limited to, hard and floppy disks, tape cassettes, and compact disks. The processor 204 is also conventionally coupled to a cache memory 214, which is usually static random access memory ("SRAM"), and to DRAM 202. It will be understood, however, that the flip-chip semiconductor device 206 configured according to one or more of the embodiments of the present invention may be incorporated into any one of the cache, DRAM, input, output, storage and processor devices 214, 202, 208, 210, 212, and 204.

Figure 12:
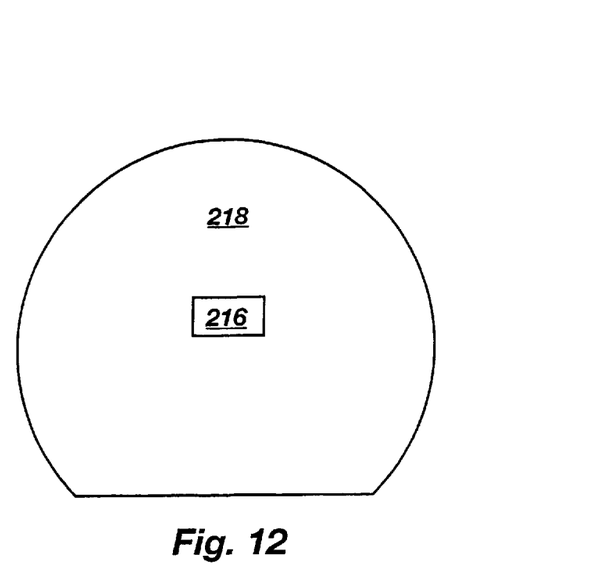
FIG. 12 is a diagram of semiconductor wafer comprising a flip-chip semiconductor device according to an embodiment of the present invention.

As shown in FIG. 12, flip-chip semiconductor devices 218 may be fabricated on the surface of a semiconductor wafer 216 of silicon, gallium arsenide, or indium phosphide in accordance with one or more embodiments of the present invention. One of ordinary skill in the art will understand how to adapt such designs for a specific die architecture or semiconductor fabrication process. Of course, it should be understood that signal lines and, optionally, ground planes in accordance with the present invention may be fabricated on semiconductor substrates other than a wafer, such as a Silicon-on-Insulator (SOI) substrate, a Silicon-on-Glass (SOG) substrate, a Silicon-on-Sapphire (SOS) substrate, or other semiconductor material layers on supporting substrates.

Although the present invention has been shown and described with reference to particular preferred embodiments, various additions, deletions and modifications that are obvious to a person skilled in the art to which the invention pertains, even if not shown or specifically described herein, are deemed to lie within the scope of the invention as encompassed by the following claims.

What is claimed is:

1. A semiconductor substrate comprising:
   an active surface including integrated circuitry therein;
   a dielectric layer disposed over said active surface, said dielectric layer having at least one via therethrough; and
   a plurality of conductive lines disposed in said dielectric layer and coupled to said integrated circuitry, wherein each of said plurality of conductive lines has a length substantially equal to each other.

2. The semiconductor substrate of claim 1, further comprising at least one conductive element coupled to at least some of said plurality of conductive lines.

3. The semiconductor substrate of claim 1, further comprising at least one ground plane between portions of said plurality of conductive lines and said active surface and separated from each of said plurality of conductive lines and portions of said active surface by at least one dielectric layer.

4. The semiconductor substrate of claim 3, further comprising a second dielectric layer disposed over said plurality of conductive lines and a ground plane disposed over said second dielectric layer.

5. The semiconductor substrate of claim 1, further comprising a second dielectric layer disposed over said plurality of conductive lines and a ground plane disposed over said second dielectric layer.

6. The semiconductor substrate of claim 1, further comprising a substrate having contact pads thereon, wherein at least some of said contact pads are each bonded to a conductive element.

7. The semiconductor substrate of claim 1, wherein said semiconductor substrate comprises a flip-chip semiconductor device.

8. The semiconductor substrate of claim 1, wherein said semiconductor substrate comprises a ball grid array coupled to portions of said plurality of conductive lines.

9. The semiconductor substrate of claim 1, wherein said semiconductor substrate comprises a wafer.

10. A semiconductor substrate comprising:
    an active surface;
    a first array of connections on said active surface; and
    a second array of connections disposed over said active surface, said first array of connections interconnected to said second array of connections through a plurality of conductive lines of substantially equal lengths.

11. The semiconductor substrate of claim 10, further comprising at least one ground plane disposed over said active surface and electrically isolated from said first array of connections and said second array of connections.

12. The semiconductor substrate of claim 10, further comprising at least two ground planes disposed on opposing planar sides of a layer including said second array of connections, each ground plane separated from said second array of connections by at least one dielectric layer.

13. The semiconductor substrate of claim 10, wherein said first array of connections comprises an array of bond pads.

14. The semiconductor substrate of claim 10, wherein said second array of connections comprises an array of conductive bumps.

15. The semiconductor substrate of claim 10, wherein each of said plurality of conductive lines comprises at least one of a bond wire portion and a conductive trace portion.

16. The semiconductor substrate of claim 10, wherein said first array of connections comprises a row of bond pads.

17. The semiconductor substrate of claim 10, wherein said first array of connections comprises multiple rows of bond pads.

18. The semiconductor substrate of claim 10, wherein said second array of connections is substantially uniformly distributed over said active surface.

19. A semiconductor substrate comprising:
    an active surface having integrated circuitry therein; and
    a plurality of conductive lines each extending between a portion of said integrated circuitry and a conductive element disposed proximate said active surface, said plurality of conductive lines each having a length substantially equal to each other.

20. The semiconductor substrate of claim 19, further comprising at least one ground plane disposed over said active surface and electrically isolated from said plurality of conductive lines.

* * * * *

UNITED STATES PATENT AND TRADEMARK OFFICE
CERTIFICATE OF CORRECTION

PATENT NO. : 6,713,879 B2  
APPLICATION NO. : 10/191654  
DATED : March 30, 2004  
INVENTOR(S) : Salman Akram and John O. Jacobson Page 1 of 1

It is certified that error appears in the above-identified patent and that said Letters Patent is hereby corrected as shown below:

On the title page:
In ITEM (54) "Title," change "SEMICONDUCTOR SUBSTRACT WITH SUBSTANTIALLY MATCHED LINES" to --SEMICONDUCTOR SUBSTRATE WITH SUBSTANTIALLY MATCHED LINES--

In the specification:
COLUMN 1, LINE 1, change "SUBSTRACT" to --SUBSTRATE--

Signed and Sealed this

Fourth Day of September, 2007

JON W. DUDAS  
*Director of the United States Patent and Trademark Office*